(12) United States Patent
Elian et al.

(10) Patent No.: US 10,852,363 B2
(45) Date of Patent: Dec. 1, 2020

(54) SIDE-BIASED CURRENT SENSOR WITH IMPROVED DYNAMIC RANGE

(71) Applicant: Infineon Technologies AG, Neubiberg (DE)

(72) Inventors: Klaus Elian, Alteglofsheim (DE); Rainer Markus Schaller, Saal (DE)

(73) Assignee: Infineon Technologies AG, Neubiberg (DE)

( * ) Notice: Subject to any disclaimer, the term of this patent is extended or adjusted under 35 U.S.C. 154(b) by 26 days.

(21) Appl. No.: 15/864,313

(22) Filed: Jan. 8, 2018

(65) Prior Publication Data
US 2019/0212398 A1    Jul. 11, 2019

(51) Int. Cl.
| | |
|---|---|
| *G01R 15/20* | (2006.01) |
| *G01R 33/02* | (2006.01) |
| *G01R 33/00* | (2006.01) |
| *G01R 19/00* | (2006.01) |
| *H01F 7/02* | (2006.01) |

(52) U.S. Cl.
CPC ....... *G01R 33/0005* (2013.01); *G01R 15/205* (2013.01); *G01R 15/207* (2013.01); *G01R 19/0092* (2013.01); *G01R 33/02* (2013.01); *G01R 15/20* (2013.01); *G01R 15/202* (2013.01)

(58) Field of Classification Search
CPC .... G01R 33/0005; G01R 33/02; G01R 33/06; G01R 33/07; G01R 33/072; G01R 33/075; G01R 33/077; G01R 33/09; G01R 33/091; G01R 33/095; G01R 33/096; G01R 19/00; G01R 19/0092; G01R 19/0023; G01R 19/08; G01R 19/14; G01R 19/145; G01R 19/165; G01R 19/175; G01R 15/20; G01R 15/202; G01R 15/205; G01R 15/207; G01R 33/093; G01R 33/098; G01R 33/0094; H01F 7/0273; H01F 7/0294

See application file for complete search history.

(56) References Cited

U.S. PATENT DOCUMENTS

| | | | | |
|---|---|---|---|---|
| 2005/0156587 | A1* | 7/2005 | Yakymyshyn | ........ G01R 15/207 324/117 R |
| 2012/0032673 | A1* | 2/2012 | Maekawa | .............. B82Y 25/00 324/252 |
| 2014/0111196 | A1* | 4/2014 | Sakai | ................. G01R 19/0092 324/252 |
| 2014/0327437 | A1* | 11/2014 | Han | ........................ G01R 19/32 324/252 |
| 2015/0177286 | A1* | 6/2015 | Fuji | ......................... G01R 22/06 324/144 |
| 2017/0288130 | A1* | 10/2017 | Strutz | .................... G01R 33/07 |
| 2017/0322237 | A1* | 11/2017 | Hanley | ................ G01R 15/202 |
| 2017/0356968 | A1* | 12/2017 | Schaller | ................. G01R 33/07 |
| 2018/0188294 | A1* | 7/2018 | Kawanami | ........... G01R 15/202 |
| 2019/0170795 | A1* | 6/2019 | Sugito | .................... G01R 15/20 |

* cited by examiner

*Primary Examiner* — David M Schindler
(74) *Attorney, Agent, or Firm* — Harrity & Harrity, LLP

(57) ABSTRACT

A semiconductor package may include a sensor chip to measure an amount of electrical current in a current medium. The sensor chip may include a first magnetic sensing element and a second magnetic sensing element. The semiconductor package may include a magnet that produces a magnetic field. The magnet may be arranged asymmetrically with respect to the first magnetic sensing element and the second magnetic sensing element such that a strength of the magnetic field at the first magnetic sensing element is different from a strength of the magnetic field at the second magnetic sensing element.

20 Claims, 6 Drawing Sheets

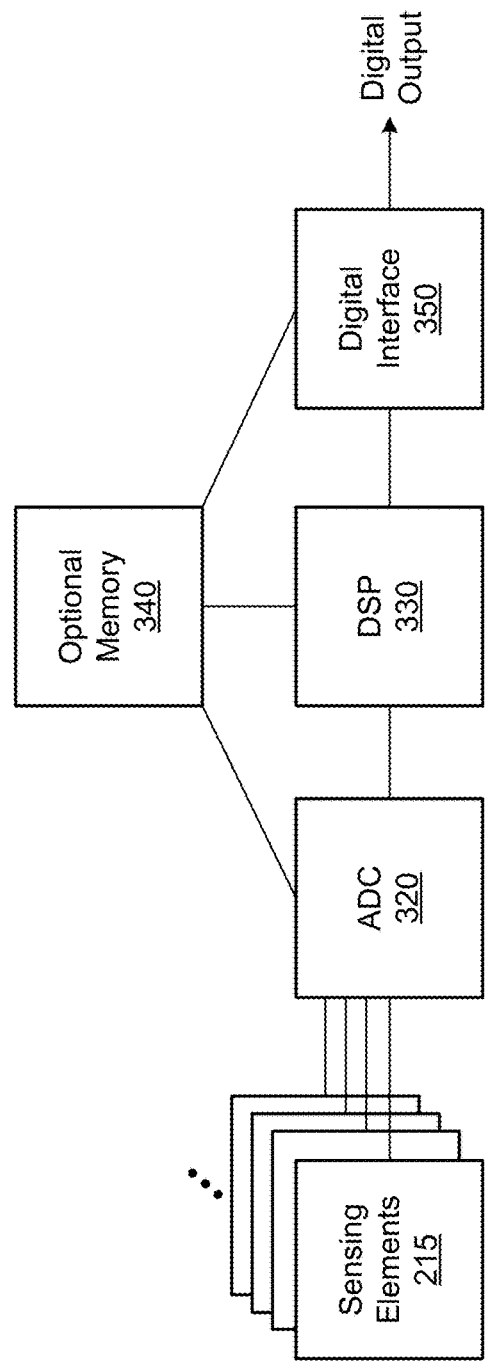

SIDE-BIASED CURRENT SENSOR WITH IMPROVED DYNAMIC RANGE

BACKGROUND

A current sensor is a device that can be used to measure an amount of electrical current in a current medium (e.g., a power cable, a wire, and/or the like). For example, the current sensor may be a magnetic current sensor that measures the amount of current based on a magnetic field generated by the current, or a shunt-based current sensor that measures the current based on a voltage drop across a resistive shunt.

SUMMARY

According to some possible implementations, a semiconductor package may include: a sensor chip to measure an amount of electrical current in a current medium, the sensor chip including a first magnetic sensing element and a second magnetic sensing element; and a magnet that produces a magnetic field, wherein the magnet is arranged asymmetrically with respect to the first magnetic sensing element and the second magnetic sensing element such that a strength of the magnetic field at the first magnetic sensing element is different from a strength of the magnetic field at the second magnetic sensing element.

According to some possible implementations, a current sensor package may include: a sensor chip including a first magnetic sensing element and a second magnetic sensing element; and a magnet that produces a magnetic field, wherein the magnet is arranged at a first distance from the first magnetic sensing element, and wherein the magnet is arranged at a second distance from the second magnetic sensing element, wherein the first distance is different from the second distance such that a strength of the magnetic field at the first magnetic sensing element is different from a strength of the magnetic field at the second magnetic sensing element.

According to some possible implementations, a sensor package may include: a sensor chip to measure an amount of electrical current in a current medium based on a magnetic field generated by the electrical current, the sensor chip including at least two magnetic sensing elements; and a magnet that produces a bias magnetic field, wherein the magnet is arranged such that the magnet asymmetrically biases the at least two magnetic sensing elements.

BRIEF DESCRIPTION OF THE DRAWINGS

FIG. 3 is a diagram of example elements of a sensor chip included in the example semiconductor package of FIG. 2;

DETAILED DESCRIPTION

Figure 1:
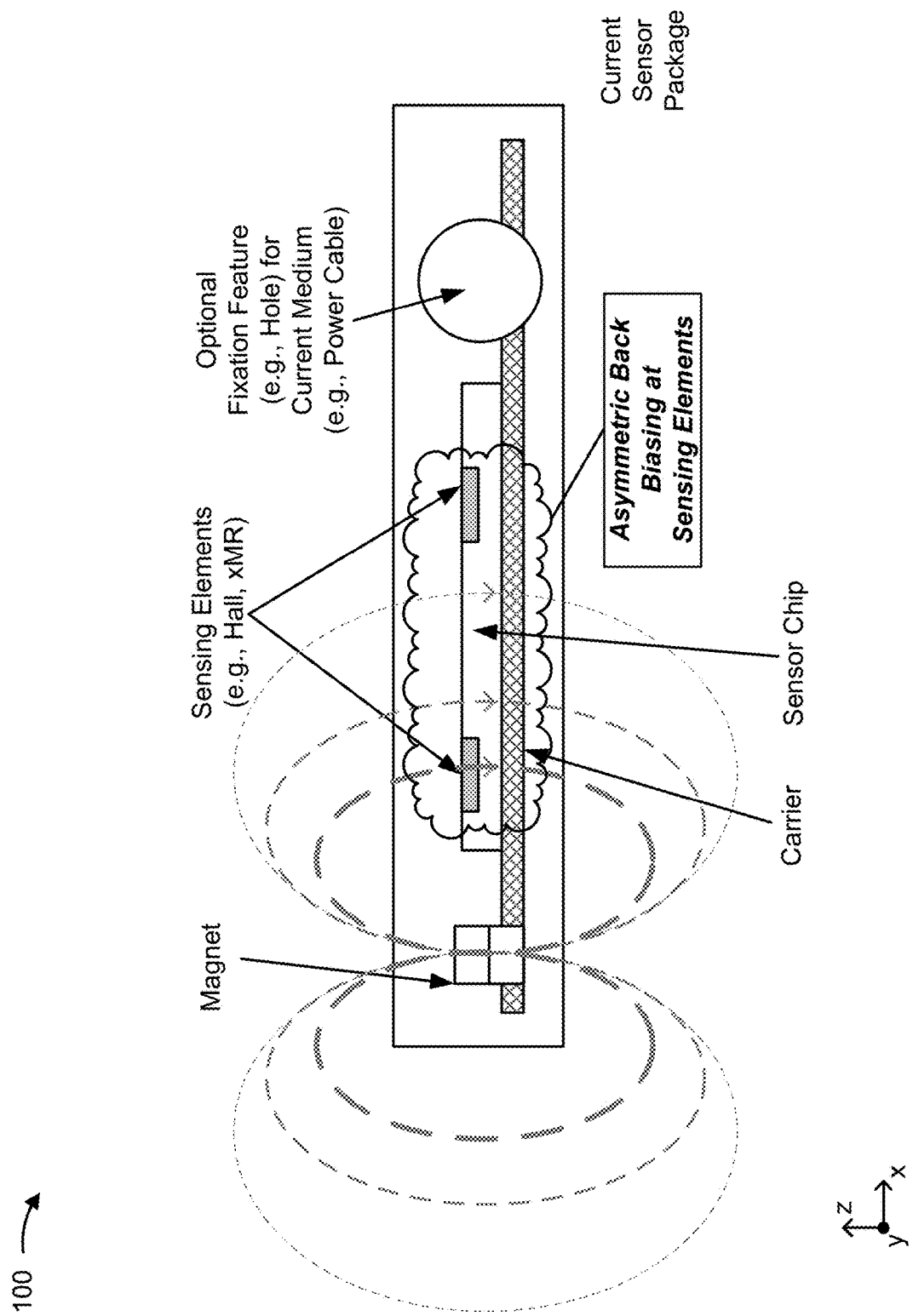
FIG. 1 is a diagram of an overview of an example implementation described herein.

The following detailed description of example implementations refers to the accompanying drawings. The same reference numbers in different drawings may identify the same or similar elements.

A current sensor may measure an amount of current in a current medium. In the case of a magnetic current sensor, the amount of current is measured based on a strength of a magnetic field that is present at one or more sensing elements (e.g., one or more Hall elements, one or more magnetoresistive (MR) elements, and/or the like), where the magnetic field is generated by the current in the current medium and, thus, is proportional to the amount of current. In the case of a shunt-based current sensor, the amount of current is measured based on a voltage drop across a resistive shunt. However, a measurement dynamic (e.g., a range of currents that can be accurately measured by the current sensor) of such conventional current sensors is limited, which renders these current sensors unusable in some applications.

For example, when measuring current in association with a state of charge control in a battery management system of an electric vehicle, the amount of current may vary widely (e.g., from a high current during acceleration of the electric vehicle to a low current while the electric vehicle is parked). In such a case, it may be necessary to accurately (e.g., within ±0.5% relative to a measured value, within ±30 milliamps (mA), and/or the like) measure the current across a large range of currents (e.g., 0 A to ±600 A) in order to, for example, comply with a functional safety requirement. However, as described above, conventional current sensors do not have a measurement dynamic sufficient to support such an application.

In some cases, this issue can be addressed by including multiple current sensors with different measurement dynamics (e.g., such that a relatively wide range of currents can be measured among the multiple current sensors, collectively) in a sensor system. However, use of multiple current sensors increases a cost and/or a complexity of the sensor system (e.g., by requiring additional components, additional connections, additional assembly, and/or the like). Similarly, the issue can be addressed by using a current sensor with a multi-die package (e.g., a current sensor including two or more integrated circuits, each supporting current measurement with a different measurement dynamic). However, this solution leads to similar increases in system cost and/or complexity.

Some implementations described herein provide a side-biased current sensor that includes a magnet and a sensor chip with multiple magnetic sensing elements, where the magnet is arranged asymmetrically with respect to the multiple magnetic sensing elements such that a strength of a bias magnetic field, produced by the magnet, at a given magnetic sensing element is different from a strength of the bias magnetic field at other magnetic sensing elements. In other words, the magnet may be arranged such that the magnet asymmetrically biases the multiple magnetic sensing elements. The asymmetric biasing of the multiple magnetic sensing elements improves the measurement dynamic of the side-biased current sensor (e.g., as compared to the conventional current sensors described above), as described in further detail below.

FIG. 1 is a diagram of an overview of an example implementation 100 described herein. As shown in FIG. 1, a current sensor package (referred to herein as a semiconductor package) may include a magnet and a sensor chip that are connected (e.g., attached, coupled, affixed, and/or the like) to a carrier. As further shown, the sensor chip may include at least two magnetic sensing elements (e.g., one or more Hall elements, one or more magnetoresistive (MR) elements, and/or the like). As further shown, the semiconductor package may optionally include a fixation feature (e.g., an opening, a hole, a clip, and/or the like) in which a current medium (e.g., a power cable, a wire, and/or the like, that is to carry an electric current to be measured), can be arranged.

As shown in FIG. 1, the magnet may be arranged such that the magnet asymmetrically biases the magnetic sensing elements (herein referred to as sensing elements) of the sensor chip. For example, a representation of a bias magnetic field produced by the magnet in an x-z plane is shown in FIG. 1 by dashed elliptical shapes. As indicated by the relative thickness and lengths of the dashed elliptical shapes, a strength of the bias magnetic field decreases as a distance from the magnet increases. For example, a strength of the bias magnetic field decreases in a moving direction from left to right away from the magnet. Thus, as indicated in FIG. 1, a strength of the bias magnetic field at the left sensing element is different from (e.g., greater than) a strength of the bias field at the right sensing element. In other words, the magnet is arranged asymmetrically with respect to the left and right sensing elements such that a strength of the bias magnetic field at the left sensing element is different from a strength of the bias magnetic field at the right sensing element.

In some implementations, this asymmetric biasing improves a measurement dynamic of the side-bias current sensor (e.g., as compared to the current sensors described above). For example, a current medium can be positioned with respect to the semiconductor package (e.g., through the fixation feature in a direction that is perpendicular to a plane of the page of FIG. 1). Here, when a relatively low current passes through the current medium, the relatively low current may generate a low-strength magnetic field (e.g., a magnetic field with a z-component that influences the right sensing element without saturating the right sensing element, but does not influence the left sensing element). In this example, a strength (e.g., in the z-direction) of a resulting magnetic field at the right sensing element (e.g., a result of superposing the magnetic field, generated by the current, and the bias magnetic field at the right sensing element) may be used to measure the relatively low current passing through the current medium. Thus, the side-bias current sensor may be used to measure a relatively low current in the current medium.

Continuing with this example, when a relatively high current passes through the current medium, the relatively high current may generate a high-strength magnetic field (e.g., a magnetic field with a z-component that saturates the right sensing element and influences the left sensing element). In this example, a strength (e.g., in the z-direction) of a resulting magnetic field at the left sensing element (e.g., a result of superposing the magnetic field, generated by the current, and the bias magnetic field, generated by the magnet, at the left sensing element) may be used to measure the relatively high current in the current medium. Thus, the side-bias current sensor may be used to measure a relatively high current in the current medium.

In this way, the magnet may be arranged such that the magnet asymmetrically biases the sensing elements of the sensor chip, thereby improving the measurement dynamic of the side-biased current sensor (e.g., by allowing relatively high and low currents to be accurately measured).

As indicated above, FIG. 1 is provided merely as an example. Other examples are possible and may differ from what was described with regard to FIG. 1.

Figure 2:
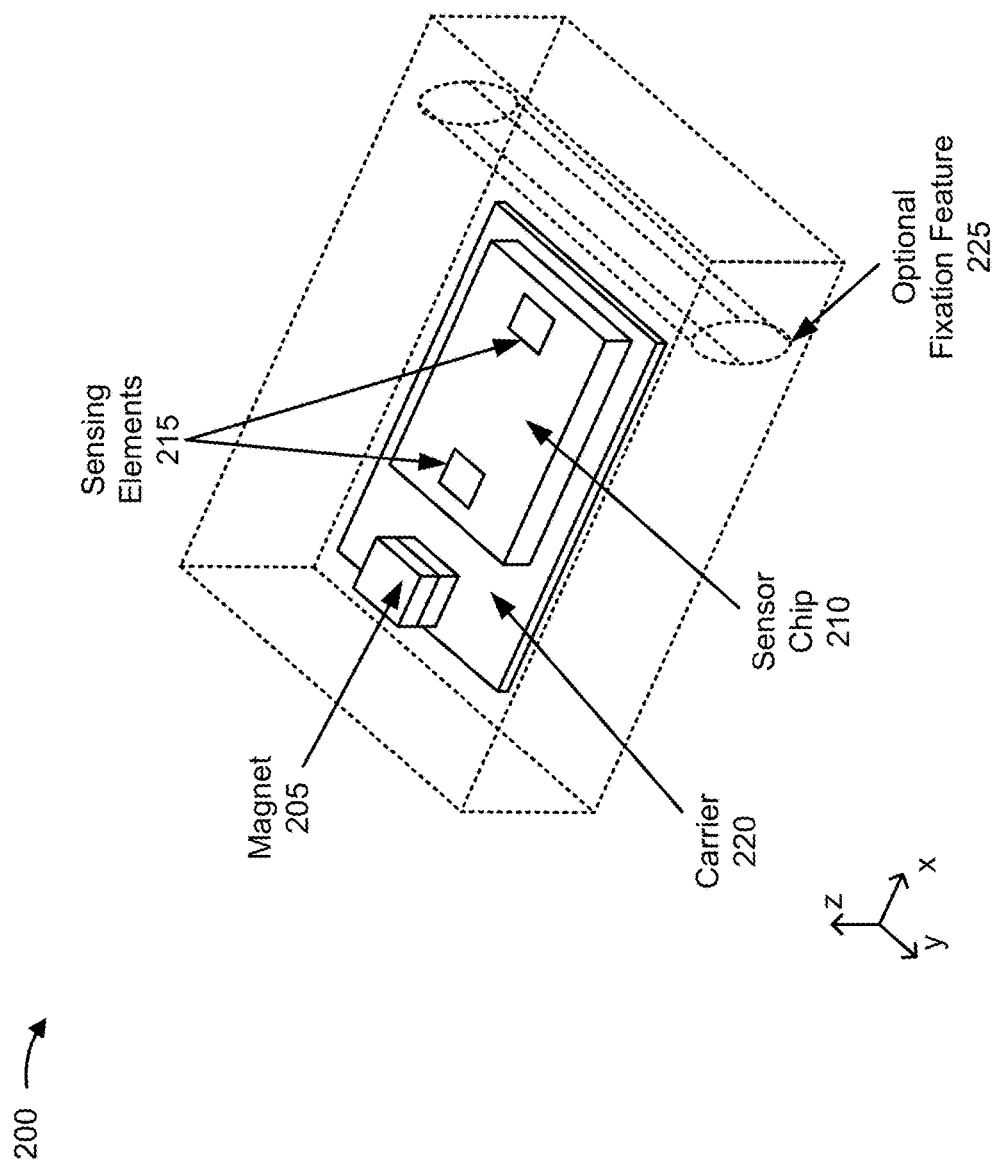
FIG. 2 is a diagram of an example semiconductor package for a side-biased current sensor.

FIG. 2 is a diagram of an example a semiconductor package 200 for a side-biased current sensor. As shown in FIG. 2, semiconductor package 200 may include a magnet 205, a sensor chip 210 including at least two sensing elements 215, a carrier 220, and an optional fixation feature 225.

Magnet 205 includes a permanent magnet that is connected (e.g., attached, coupled, affixed, and/or the like) to carrier 220. In some implementations, magnet 205 comprises a first half forming a north pole (N) and a second half forming a south pole (S), so that magnet 205 comprises one pole pair. For example, magnet 205 may include an axially magnetized magnet with a north pole on a first half of magnet 205 that is stacked (e.g., along the z-direction) on a south pole on a second half of magnet 205. Additionally, or alternatively, magnet 205 may include a dipole magnet (e.g., a dipole bar magnet, a circular dipole magnet, an elliptical dipole magnet, etc.), a permanent magnet, and/or the like. In some implementations, magnet 205 may, without limitation, comprise more than one pole pair. Notably, while magnet 205 is shown as having a square shape in FIG. 2, magnet 205 may have another shape, such as a rectangular shape, a circular shape, an elliptical shape, a triangular shape, a ring shape, and/or the like.

In some implementations, magnet 205 may be comprised of a ferromagnetic material (e.g., Hard Ferrite), and may produce a bias magnetic field. In some implementations, magnet 205 may comprise a rare earth magnet.

In some implementations, a dimension of magnet 205 (e.g., a length, a width, a height, a diameter, a radius, and/or the like) may be in a range from approximately 1 millimeter (mm) to approximately 6 mm, such as approximately 3 mm. For example, magnet 205 may be a cube-shaped magnet measuring approximately 3 mm×3 mm×3 mm.

In some implementations, magnet 205 may be (e.g., mechanically) connected to carrier 220 such that magnet 205 is arranged asymmetrically with respect to sensing elements 215 of sensor chip 210, as described in further detail below. In other words, magnet 205 may be arranged such that a strength of a bias magnetic field, produced by magnet 205, is different at each sensing element 215 (i.e., such that magnet 205 asymmetrically biases sensing elements 215).

Sensor chip 210 includes a component (e.g., an integrated circuit) that provides sensing current sensing functionality. In some implementations, sensor chip 210 includes sensing elements 215 configured to sense one or more components (e.g., an x-component, a y-component, and/or a z-component) of a magnetic field present at the sensing elements 215 (e.g., resulting magnetic field that is a result of superposing the bias magnetic field, produced by magnet 205, and a magnetic field generated by current passing through a current medium).

As shown in FIG. 2, sensor chip 210 may include two sensing elements 215 in some implementations. However, the number of sensing elements 215 is not limited to two (e.g., sensor chip 210 may include three or more sensing elements 215). In some implementations, sensor chip 210 may be connected to carrier 220 (e.g., such that sensor chip 210 is at a fixed distance from magnet 205). Additional details regarding sensing elements 215 and other components of sensor chip 210 are described below with regard to FIG. 3.

In some implementations, magnet 205 and sensor chip 210 may be arranged with one another such that sensing elements 215 of sensor chip 210 are at different distances relative to magnet 205 (i.e., such that magnet 205 asymmetrically biases sensing elements 215 of sensor chip 210). For example, as shown in FIG. 2, magnet 205 may be arranged such that magnet 205 is comparatively closer to a first sensing element 215 (e.g., a left sensing element 215 in FIG. 2) than a second sensing element 215 (e.g., a right sensing element 215 in FIG. 2). In some implementations, such asymmetric biasing improves a measurement dynamic of a current sensing capability provided by sensor chip 210, as described herein.

Notably, while sensing elements 215 of sensor chip 210 are shown as being aligned along a particular direction (e.g., an x-direction), such alignment is not necessary, and other arrangements are possible (e.g., so long as magnet 205 can be arranged such that magnet 205 is at different distances relative to sensing elements 215).

In some implementations, a distance between a given sensing element 215 of sensor chip 210 and magnet 205 may be in a range from approximately 0.5 mm to approximately 9 mm. Taking FIG. 2 as an example, a distance from magnet 205 to the left sensing element 215 may be approximately 2 mm, while a distance from magnet 205 to the right sensing element 215 may be approximately 4 mm. In a case where sensor chip 210 includes a third sensing element 215 arranged between the left sensing element 215 and the right sensing element 215, a distance from magnet 205 to the third sensing element 215 may be approximately 3 mm. In this way, a strength of a bias magnetic field, produced by magnet 205, is different at each sensing element 215. In some implementations, a distance between a given pair of sensing elements 215 on sensor chip 210 may be in a range from approximately 0.5 mm to approximately 4 mm, such as 1 mm or 2 mm.

Carrier 220 includes a component (e.g., a substrate) to which magnet 205 and sensor chip 210 are connected (e.g., attached, coupled, affixed, and/or the like). In some implementations, carrier 220 may comprise a leadframe, a laminate material, a printed circuit board, and/or another type of component. In some implementations, carrier 220 may serve to maintain a fixed distance between magnet 205 and sensor chip 210.

Optional fixation feature 225 includes a feature associated with positioning a current medium (e.g., a power cable, a wire, and/or the like) near sensor chip 210 (e.g., such that a magnetic field, generated by current passing through the current medium, may be present at sensing elements 215). For example, as shown in FIG. 2, fixation feature 225 may include a hole or an opening in semiconductor package 200 through which the current medium may pass. As another example, fixation feature 225 may include a mechanism (e.g., a clip, an arm, and/or the like) on the outside of the package with which the current medium may be held in place relative to sensor chip 210. In some implementations, fixation feature 225 may position the current medium such that the current medium runs in the z-direction, the y-direction, the x-direction, or another direction.

Notably, while FIG. 2 shows sensor chip 210 being arranged between magnet 205 and a location at which a current medium may be positioned (e.g., such that sensor chip 210 is between magnet 205 and fixation feature 225), other arrangements are possible. For example, in another example arrangement, magnet 205 may be arranged between sensor chip 210 and fixation feature 225. Generally, magnet 205 and sensor chip 210 may be arranged in any arrangement in which magnet 205 is at a different distance relative to each sensing element 215 of sensor chip 210.

In some implementations, as indicated by the dashed three-dimensional outline in FIG. 2, semiconductor package 200 may include an optional encapsulation material that encapsulates magnet 205, sensor chip 210, and/or carrier 220. In some implementations, fixation feature 225 may be formed in the encapsulation material, as indicated in FIG. 2. In some implementations, the encapsulation material may include a mold compound, a plastic material, a housing, and/or the like.

While not shown in FIG. 2, in some implementations, semiconductor package 200 may further include a component (e.g., an interconnect, a lead, a lead frame, and/or the like) for connecting semiconductor package 200 to, for example, a controller (e.g., a controller associated with a controlling a system based on a current measured by the side-biased current sensor).

The number and arrangement of components, elements, and features shown in FIG. 2 are provided as examples. In practice, there may be additional components, elements, and/or features, fewer components, elements, and/or features, different components, elements, and/or features, or differently arranged components, elements, and/or features than those shown in FIG. 2. Furthermore, two or more components and/or elements shown in FIG. 2 may be implemented within a single component and/or element, or a single component and/or element shown in FIG. 2 may be implemented as multiple, distributed components and/or elements. Additionally, or alternatively, a set of components and/or elements (e.g., one or more components or one or more elements) of FIG. 2 may perform one or more functions described as being performed by another set of components and/or elements of FIG. 2.

FIG. 3 is a diagram of example elements of sensor chip 210 included in example semiconductor package 200 of FIG. 2. As shown, sensor chip 210 may include a set of sensing elements 215, an analog-to-digital convertor (ADC) 320, a digital signal processor (DSP) 330, an optional memory element 340, and a digital interface 350.

Sensing element 215 includes an element for sensing a component of a magnetic field present at sensing element 215. For example, sensing element 215 may include a Hall-based sensing element that operates based on a Hall-effect. As another example, sensing element 215 may include a MR-based sensing element, elements of which are comprised of a magnetoresistive material (e.g., nickel-iron (NiFe)), where the electrical resistance of the magnetoresistive material may depend on a strength and/or a direction of the magnetic field present at the magnetoresistive material. Here, sensing element 215 may operate based on an anisotropic magnetoresistance (AMR) effect, a giant magnetoresistance (GMR) effect, a tunnel magnetoresistance (TMR) effect, and/or the like. As an additional example, sensing element 215 may include a variable reluctance (VR) based sensing element that operates based on induction.

In some implementations, sensor chip 210 may include multiple sensing elements 215 (e.g., two or more sensing elements 215). In some implementations, one or more sensing elements 215 may be sensitive in a direction that is substantially perpendicular to a plane corresponding to surface of sensor chip 210 (e.g., a z-direction as identified in FIG. 2). Additionally, or alternatively, one or more sensing elements 215 may be sensitive in a direction that is substantially parallel to the plane corresponding to surface of sensor chip 210 (e.g., an x-direction or a y-direction as identified in FIG. 2).

In some implementations, two or more sensing elements 215 of sensor chip 210 may have a same direction of sensitivity. For example, a first sensing element 215 and a second sensing element 215 may both be sensitive in a same direction (e.g., the z-direction, the direction that is substantially perpendicular to the plane corresponding to the surface of sensor chip 210). Additionally, or alternatively, two or more sensing elements 215 of sensor chip 210 may have different directions of sensitivity. For example, a first sensing element 215 may be sensitive in a first direction (e.g., the z-direction), while a second sensing element 215 may be sensitive in a second direction (e.g., the x-direction). As another example, a first sensing element 215 may be sensitive in a first direction (e.g., the z-direction), a second sensing element 215 may be sensitive in a second direction (e.g., the x-direction), and a third sensing element 215 may be sensitive in a third direction (e.g., the y-direction).

ADC 320 may include an analog-to-digital converter that converts an analog signal from sensing elements 215 to a digital signal. For example, ADC 320 may convert analog signals, received from the set of sensing elements 215, into digital signals to be processed by DSP 330. ADC 320 may provide the digital signals to DSP 330. In some implementations, sensor chip 210 may include one or more ADCs 320.

DSP 330 may include a digital signal processing device or a collection of digital signal processing devices. In some implementations, DSP 330 may receive digital signals from ADC 320 and may process the digital signals to form output signals (e.g., destined for a controller to which semiconductor package 200 is connected), such as output signals associated with an amount of current measured as passing through a current medium.

Optional memory element 340 may include a read only memory (ROM) (e.g., an EEPROM), a random access memory (RAM), and/or another type of dynamic or static storage device (e.g., a flash memory, a magnetic memory, an optical memory, etc.) that stores information and/or instructions for use by sensor chip 210. In some implementations, optional memory element 340 may store information associated with processing performed by DSP 330. Additionally, or alternatively, optional memory element 340 may store configurational values or parameters for the set of sensing elements 215 and/or information for one or more other elements of sensor chip 210, such as ADC 320 or digital interface 350.

Digital interface 350 may include an interface via which sensor chip 210 may receive and/or provide information from and/or to another device, such as a controller. For example, digital interface 350 may provide the output signal, determined by DSP 330, to the controller and may further receive information from the controller.

The number and arrangement of components and elements shown in FIG. 3 are provided as an example. In practice, sensor chip 210 may include additional components and/or elements, fewer components and/or elements, different components and/or elements, or differently arranged components and/or elements than those shown in FIG. 3. Additionally, or alternatively, a set of components and/or elements (e.g., one or more components or one or more elements) of sensor chip 210 may perform one or more functions described as being performed by another set of components and/or elements of sensor chip 210.

Figure 4A:
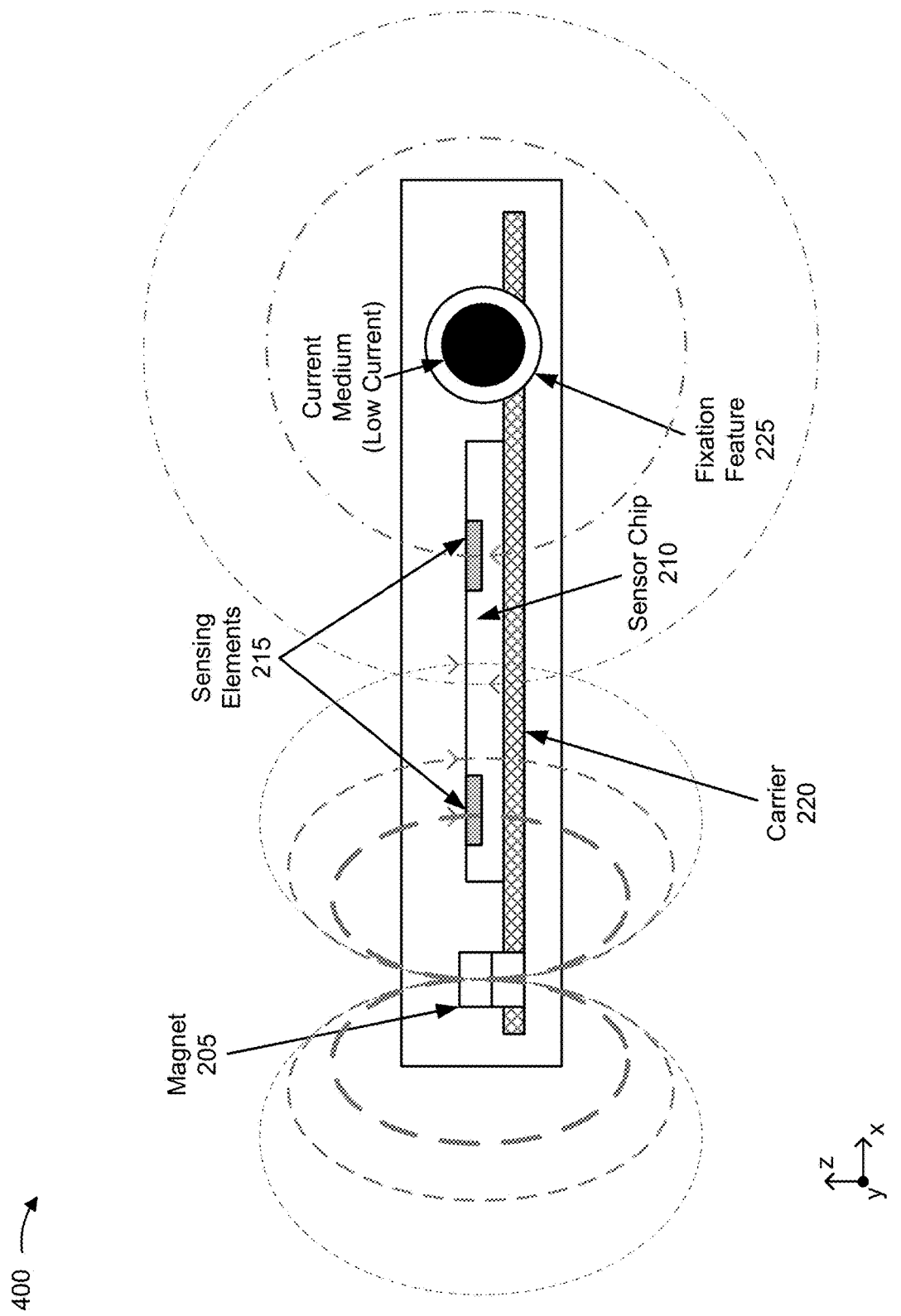
FIGS. 4A and 4B are diagrams associated with an example implementation of a semiconductor package for a side-biased current sensor.
Figure 4B:
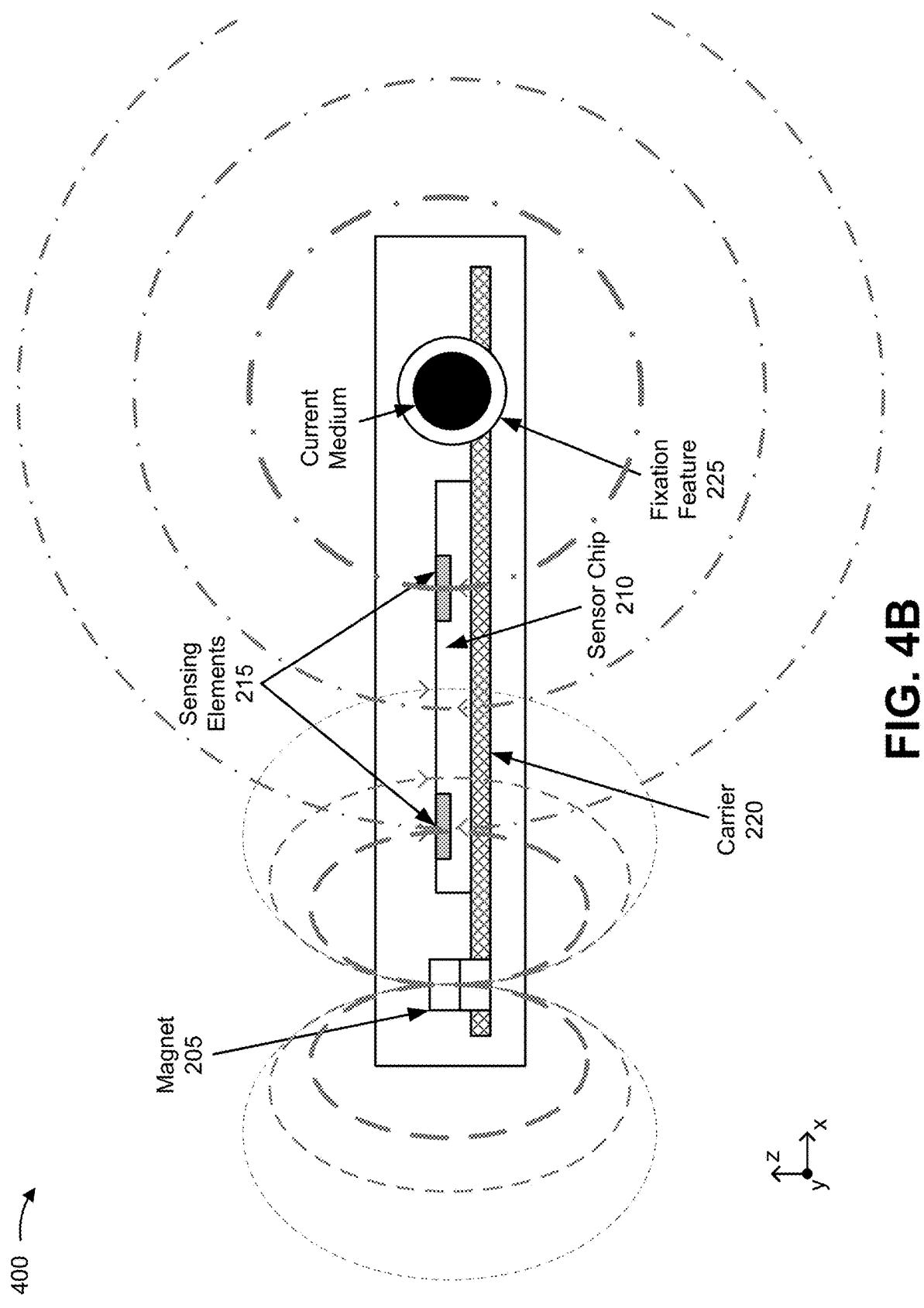

FIGS. 4A and 4B are diagrams associated with an example implementation 400 of a semiconductor package 200 for a side-biased current sensor. FIG. 4A illustrates an example associated with measuring a relatively low current generated by a current medium, while FIG. 4B illustrates an example associated with measuring a relatively high current generated by the current medium.

As shown in FIG. 4A, magnet 205 may be arranged such that magnet 205 asymmetrically biases sensing elements 215 of sensor chip 210. For example, a representation of a bias magnetic field produced by magnet 205 in an x-z plane is shown in FIG. 4A by dashed elliptical shapes. As indicated by the relative thickness and lengths of the dashed elliptical shapes, a strength of the bias magnetic field decreases as a distance from magnet 205 increases. For example, a strength of the bias magnetic field decreases moving from left to right away from magnet 205. Thus, as indicated in FIG. 4A, a strength of the z-component of the bias magnetic field at the left sensing element 215 is greater than a strength of the z-component of the bias field at the right sensing element 215. In other words, magnet 205 is arranged asymmetrically with respect to the left and right sensing elements 215 such that a strength of the z-component of the bias magnetic field at the left sensing element 215 is different from a strength of the z-component of the bias magnetic field at the right sensing element 215. In some implementations, the bias magnetic field may not influence one or more sensing elements 215 of sensor chip 210 (e.g., the bias magnetic field may not be strong enough to reach the right sensing element 215).

As further shown in FIG. 4A, a current medium may be positioned such that the current medium passes through fixation feature 225. For example, the current medium may be a power cable that passes through an opening through semiconductor package 200 in the y-direction. When a relatively low current passes through the current medium, the relatively low current may generate a low-strength magnetic field. A magnetic field generated by a current is herein referred to as a current-generated magnetic field. A representation of the low-strength current-generated magnetic field in the x-z plane is shown in FIG. 4A by dashed and dotted circular shapes.

As shown, the low-strength current-generated magnetic field may influence the right sensing element 215 (e.g., without saturating the right sensing element 215), but may not influence the left sensing element 215. In this example, the strength of a resulting z-component at the right sensing element 215 (e.g., a result of superposing the z-component of the low-strength current-generated magnetic field and the z-component of the bias magnetic field at the right sensing element 215) may be used to measure the current passing through the current medium. For example, sensor chip 210 may determine, based on the strength of the resulting z-component at the right sensing element 215, that the right sensing element 215 is not saturated (e.g., that the strength of the resulting z-component is below a threshold field strength that limits an operable range of the right sensing element 215), and may measure the amount of current based on the strength of the resulting z-component at the right sensing element 215. In this way, the side-bias current sensor may be capable of accurately measuring a relatively low current passing through the current medium.

In FIG. 4B, assume that a relatively high current passes through the current medium. As shown, the relatively high current may generate a high-strength magnetic field, as shown by the comparatively darker and wider dashed and dotted circular shapes. As shown, the high-strength current-generated magnetic field may saturate the right sensing element 215, and may influence the left sensing element 215 (e.g., without saturating the left sensing element 215). Here, the left sensing element 215 may not be saturated due to the strength of the bias field at the left sensing element 215 (e.g., the bias magnetic field at the left sensing element 215 may operate to at least partially negate the current-generated magnetic field at the left sensing element 215).

In this example, the strength of a resulting z-component at the left sensing element 215 (e.g., a result of superposing the z-component of the high-strength current-generated magnetic field and the z-component of the bias magnetic field at the left sensing element 215) may be used to measure the current passing through the current medium. For example, sensor chip 210 may determine, based on the strength of the resulting z-component at the right sensing element 215, that the right sensing element 215 is saturated (e.g., that the strength of the resulting z-component is above the threshold field strength that limits the operable range of the right sensing element 215), may determine that the left sensing element 215 is not saturated, and may measure the amount of current based on the strength of the resulting z-component at the left sensing element 215. In this way, the side-bias current sensor may be capable of accurately measuring a relatively high current passing through the current medium.

In some implementations, the side-bias current sensor (e.g., sensor chip 210) may measure the amount of current based on a strength of a magnetic field at one or more sensing elements 215. For example, sensor chip 210 may measure the amount of current based on the strength of the resulting z-component at the left sensing element 215 or the strength of the resulting z-component at the right sensing element 215, as described in the above examples.

As another example, sensor chip 210 may measure the amount of current based on the strength of the resulting z-component at the left sensing element 215 and the strength of the resulting z-component at the right sensing element 215.

As still another example, in a case where sensor chip 210 includes a center sensing element 215 (e.g., arranged between the left sensing element 215 and the right sensing element 215), sensor chip 210 may measure the amount of current based on the strength of the resulting z-component at the left sensing element 215 and a strength of a resulting z-component at the center sensing element 215, based on the strength of the resulting z-component at the right sensing element 215 and the strength of the resulting z-component at the center sensing element 215, and/or based on the strength of the resulting z-components at each of the left, right, and center sensing elements 215.

In some implementations, when sensor chip 210 is to measure the amount of current based on components of resulting magnetic fields at multiple sensing elements 215, sensor chip 210 may be configured with an algorithm for determining the amount of current based on the multiple strengths (e.g., an algorithm that defines a process for measuring or determining the amount of current based on signals from the multiple sensing elements 215). In some implementations, upon determining the amount of current, the side-bias current sensor may provide an output (e.g., a signal that carries information that identifies the amount of current) to, for example, a controller.

In this way, magnet 205 may be arranged such that magnet 205 asymmetrically biases sensing elements 215 of sensor chip 210, thereby improving the measurement dynamic of the side-biased current sensor (e.g., by allowing relatively high and low currents to be accurately measured).

As indicated above, FIGS. 4A and 4B are provided merely as examples. Other examples are possible and may differ from what was described with regard to FIGS. 4A and 4B.

Figure 5:
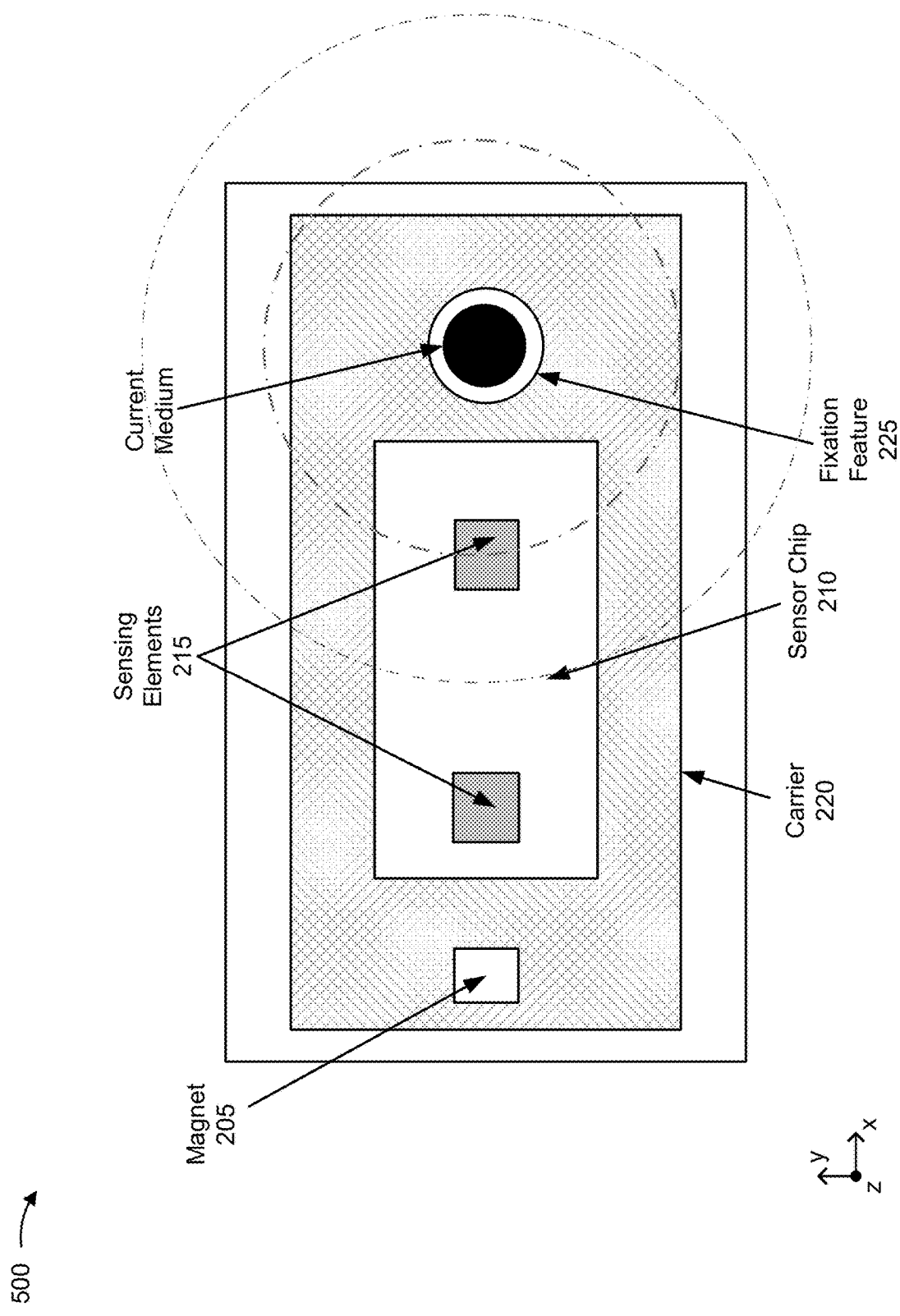
FIG. 5 is a diagram associated with another example implementation of a semiconductor package for a side-biased current sensor.

FIG. 5 is a diagram associated with another example implementation 500 of a semiconductor package 200 for a side-biased current sensor. Notably, example implementation 500 is illustrated in a view on an x-y plane, while example implementation 400 was illustrated from a view in the x-z plane.

As shown in FIG. 5, magnet 205 may be arranged in a similar manner as that described above in association with example implementation 400 (e.g., such that magnet 205 asymmetrically biases sensing elements 215 of sensor chip 210). However, in example implementation 500, sensing elements 215 of sensor chip 210 are sensitive in the x-direction. Here, an x-component of the bias magnetic field decreases in a moving direction from left to right away from magnet 205 (not shown). In other words, magnet 205 is arranged asymmetrically with respect to the left and right sensing elements 215 such that a strength of the x-component of the bias magnetic field at the left sensing element 215 is different from a strength of the x-component of the bias magnetic field at the right sensing element 215.

As further shown in FIG. 5, a current medium may be positioned such that the current medium passes through fixation feature 225. In this example, the current medium may be a power cable that passes through an opening through semiconductor package 200 in the z-direction (e.g., at an orientation that is 90 degrees different than that shown in association with example implementation 400). As shown by the dashed and dotted circular shapes in FIG. 5, when a current passes through the current medium, the current may generate a magnetic field.

In this example, sensor chip 210 may measure the current in the current medium using techniques similar to those described above in association with example implementation 400. However, in this example, and when the sensing elements 215 are sensitive in the x-direction, x-components of resulting magnetic fields at the left and right sensing elements may be used for measuring the current (e.g., rather than z-components).

As indicated above, FIG. 5 is provided merely as an example. Other examples are possible and may differ from what was described with regard to FIG. 5.

Notably, while example implementations 400 and 500 are described as using sensing elements 215 that are sensitive in the z-direction and the x-direction, respectively, other implementations are possible. For example, when the left sensing element 215 is sensitive in the z-direction and the right sensing element 215 is sensitive in the x-direction, sensor chip 210 may measure the amount of current based on the strength of the resulting z-component at the left sensing element 215 and the strength of the resulting x-component at the right sensing element 215.

As another example, when the left sensing element 215 is sensitive in the y-direction and the right sensing element 215 is sensitive in the x-direction, sensor chip 210 may measure the amount of current based on the strength of the resulting y-component at the left sensing element 215 and the strength of the resulting x-component at the right sensing element 215.

As another example, when the left sensing element 215 is sensitive in the y-direction and the right sensing element 215 is sensitive in the z-direction, sensor chip 210 may measure the amount of current based on the strength of the resulting y-component at the left sensing element 215 and the strength of the resulting z-component at the right sensing element 215.

The above cases are provided as examples, and other implementations are possible (e.g., including one or more additional sensing elements 215, including other combinations of sensing elements 215 with different directional sensitivity, and/or the like).

Some implementations described herein provide a side-biased current sensor that includes a magnet and a sensor chip with multiple magnetic sensing elements, where the magnet is arranged asymmetrically with respect to the multiple magnetic sensing elements such that a strength of a bias magnetic field, produced by the magnet, at a given magnetic sensing element is different from a strength of the bias magnetic field at other magnetic sensing elements (e.g., such that the magnet asymmetrically biases the multiple magnetic sensing elements). The asymmetric biasing of the multiple magnetic sensing elements improves the measurement dynamic of the side-biased current sensor (e.g., as compared to the conventional current sensors described above).

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related items, and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A semiconductor package, comprising:
   a sensor chip to measure an amount of electrical current in a current medium,
      the sensor chip including a first magnetic sensing element and a second magnetic sensing element;
   a magnet that produces a magnetic field,
      wherein the magnet is arranged asymmetrically with respect to the first magnetic sensing element and the second magnetic sensing element such that a strength of the magnetic field at the first magnetic sensing element is different from a strength of the magnetic field at the second magnetic sensing element;
   a fixation feature associated with positioning the current medium,
      wherein the fixation feature includes a hole or an opening in a material of the semiconductor package,
      wherein the fixation feature is arranged in the semiconductor package such that the current medium runs through a length of the hole or the opening in a first direction parallel to a first axis, and
      wherein an entirety of the sensor chip is arranged between the magnet and the fixation feature in a second direction parallel to a second axis, the second axis being perpendicular to the first axis; and
   a carrier including a substrate,
      wherein the magnet is directly attached to the substrate,
      wherein the sensor chip is directly attached to the substrate,
      wherein the entirety of the sensor chip is arranged on a plane of the substrate, and
      wherein the plane of the substrate is parallel to a plane defined by the first direction and the second direction.

2. The semiconductor package of claim 1, wherein the sensor chip and the magnet are encapsulated in the material, the material being an encapsulation material.

3. The semiconductor package of claim 1, wherein a plane of a surface of the sensor chip is substantially parallel to a direction in which the electrical current is to flow through the current medium.

4. The semiconductor package of claim 1, wherein a direction of sensitivity of the first magnetic sensing element matches a direction of sensitivity of the second magnetic sensing element.

5. The semiconductor package of claim 1, wherein a direction of sensitivity of the first magnetic sensing element is different from a direction of sensitivity of the second magnetic sensing element.

6. The semiconductor package of claim 1, wherein a direction of sensitivity of the first magnetic sensing element or the second magnetic sensing element is substantially parallel to a plane corresponding to a surface of the sensor chip.

7. The semiconductor package of claim 1, wherein a direction of sensitivity of the first magnetic sensing element or the second magnetic sensing element is substantially perpendicular to a plane corresponding to a surface of the sensor chip.

8. The semiconductor package of claim 1, wherein the first magnetic sensing element and the second magnetic sensing element are at different distances from the magnet.

9. The semiconductor package of claim 1, wherein the sensor chip includes a third magnetic sensing element,
   wherein the magnet is arranged such that a strength of the magnetic field at the third magnetic sensing element is different from the strength of the magnetic field at the first magnetic sensing element, and
   wherein the magnet is arranged such that the strength of the magnetic field at the third magnetic sensing element is different from the strength of the magnetic field at the second magnetic sensing element.

10. The semiconductor package of claim 9, wherein the first magnetic sensing element, the second magnetic sensing element, and the third magnetic sensing element are arranged at different distances from the magnet.

11. The semiconductor package of claim 1, wherein the first magnetic sensing element is located between the second magnetic sensing element and the magnet.

12. The semiconductor package of claim 1, wherein the first magnetic sensing element is located closer to the magnet than the second magnetic sensing element.

13. The semiconductor package of claim 1, wherein the current medium is a power cable.

14. A current sensor package, comprising:
    a sensor chip including a first magnetic sensing element and a second magnetic sensing element;

a magnet that produces a magnetic field,
  wherein the magnet is arranged at a first distance from the first magnetic sensing element, and
  wherein the magnet is arranged at a second distance from the second magnetic sensing element,
    wherein the first distance is different from the second distance such that a strength of the magnetic field at the first magnetic sensing element is different from a strength of the magnetic field at the second magnetic sensing element;
a fixation feature associated with positioning a current medium,
  wherein the fixation feature includes a hole or an opening in a material of the current sensor package,
  wherein the fixation feature is arranged in the current sensor package such that the current medium runs through a length of the hole or the opening in a first direction parallel to a first axis, and
  wherein an entirety of the sensor chip is arranged between the magnet and the fixation feature in a second direction parallel to a second axis,
    the second axis being perpendicular to the first axis; and
a carrier including a substrate,
  wherein the magnet is directly attached to the substrate,
  wherein the sensor chip is directly attached to the substrate, and
  wherein the entirety of the sensor chip is arranged on a plane of the substrate, and
  wherein the plane of the substrate is parallel to a plane defined by the first direction and the second direction.

15. The current sensor package of claim 14, wherein the carrier further consists of at least one of:
a leadframe;
a laminate; or
a printed circuit board.

16. The current sensor package of claim 14, wherein the first magnetic sensing element is a first Hall element or a first magnetoresistive (MR) element; and
  wherein the second magnetic sensing element is a second Hall element or a second MR element.

17. The current sensor package of claim 14, wherein a direction of sensitivity of the first magnetic sensing element matches a direction of sensitivity of the second magnetic sensing element.

18. A sensor package, comprising:
a sensor chip to measure an amount of electrical current in a current medium based on a magnetic field generated by the electrical current,
  the sensor chip including at least two magnetic sensing elements;
a magnet that produces a bias magnetic field,
  wherein the magnet is arranged such that the magnet asymmetrically biases the at least two magnetic sensing elements;
a fixation feature associated with positioning the current medium,
  wherein the fixation feature includes a hole or an opening in a material of the sensor package,
  wherein the fixation feature is arranged in the sensor package such that the current medium runs through a length of the hole or the opening in a first direction parallel to a first axis, and
  wherein an entirety of the magnet is arranged between the sensor chip and the fixation feature in a second direction parallel to a second axis,
    the second axis being perpendicular to the first axis; and
a carrier including a substrate,
  wherein the magnet is directly attached to the substrate,
  wherein the sensor chip is directly attached to the substrate, and
  wherein an entirety of the sensor chip is arranged on a plane of the substrate, and
  wherein the plane of the substrate is parallel to a plane defined by the first direction and the second direction.

19. The sensor package of claim 18, wherein the material is an encapsulation material; and
  wherein the sensor chip and the magnet are encapsulated in the encapsulation material.

20. The sensor package of claim 18, wherein a first magnetic sensing element, of the at least two magnetic sensing elements, is a first Hall element or a first magnetoresistive (MR) element; and
  wherein a second magnetic sensing element, of the at least two magnetic sensing elements, is a second Hall element or a second MR element.

* * * * *